(12) United States Patent
Taito

(10) Patent No.: US 6,781,894 B2
(45) Date of Patent: Aug. 24, 2004

(54) SEMICONDUCTOR MEMORY DEVICE ACHIEVING FAST RANDOM ACCESS

(75) Inventor: Yasuhiko Taito, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/392,842

(22) Filed: Mar. 21, 2003

(65) Prior Publication Data

US 2004/0085820 A1 May 6, 2004

(30) Foreign Application Priority Data

Nov. 1, 2002 (JP) .................................... 2002-319873

(51) Int. Cl.$^7$ .................................................. G11C 7/00
(52) U.S. Cl. .................................. 365/198; 365/189.04
(58) Field of Search .................. 365/198.01, 190.04, 365/196, 207

(56) References Cited

U.S. PATENT DOCUMENTS 6,324,110 B1 * 11/2001 Leung et al. ................ 365/207
6,560,148 B2 * 5/2003 Takami et al. .............. 365/190
2002/0015344 A1 * 2/2002 Leung et al. ................ 365/207
2002/0136051 A1 * 9/2002 Hardee et al. .............. 365/149

FOREIGN PATENT DOCUMENTS

JP          2000-268570          9/2000

OTHER PUBLICATIONS

"A 1.5V Circuit Technology for 64Mb DRAMs," Y. Nakagome et al., Symposium on VLSI Circuits, 1990, pp. 17–18.

* cited by examiner

*Primary Examiner*—Thong Lei
(74) *Attorney, Agent, or Firm*—McDermott Will & Emery LLP (57) ABSTRACT

N-channel MOS transistors in a read gate circuit have respective sources connected to a sense amplifier activation line of a sense amplifier, not to a ground node. A read column selection line is selected prior to activation of the sense amplifier. Accordingly, paired read data lines are driven simultaneously with the activation of the sense amplifier.

4 Claims, 7 Drawing Sheets

SEMICONDUCTOR MEMORY DEVICE ACHIEVING FAST RANDOM ACCESS

BACKGROUND OF THE INVENTION

1. Field of the Invention

The present invention relates to semiconductor memory devices and particularly to a semiconductor memory device achieving fast random access.

2. Description of the Background Art

A semiconductor memory device disclosed in Japanese Patent Laying-Open No. 2000-268570 achieves fast data reading by allowing a read column selection signal to rise before a sense amplifier amplifies a potential difference between paired bit lines. The above-mentioned semiconductor memory device, however, fixes the potential of the source of a data-reading transistor.

Then, if the read column selection signal is raised before the sense amplifier amplifies the potential difference between paired bit lines, respective charges of paired read data lines having been precharged are both pulled down toward the ground and accordingly inputs to a preamplifier both have L (logical low) level. Therefore, data could not be read accurately in some cases.

SUMMARY OF THE INVENTION

One object of the present invention is to provide a semiconductor memory device achieving fast random access as well as accurate reading of data all the time.

According to the present invention, a semiconductor memory device includes a memory cell array including a plurality of memory cells arranged in rows and columns, a plurality of word lines arranged correspondingly to respective rows of the memory cells and a plurality of pairs of bit lines arranged correspondingly to respective columns of the memory cells, a sense amplifier provided correspondingly to each of the pairs of bit lines, and a read gate circuit provided correspondingly to each of the pairs of bit lines and connected to a pair of read data lines for reading data. The read gate circuit includes a first transistor having its gate connected to one bit line of the corresponding pair of bit lines and its source dynamically changed according to activation/inactivation of the sense amplifier, and a second transistor having its gate connected to the other bit line of the corresponding pair of bit lines and its source dynamically changed according to activation/inactivation of the sense amplifier.

According to the present invention as discussed above, respective sources of the transistors in the read gate circuit are dynamically changed according to activation/inactivation of the sense amplifier to achieve fast random access as well as accurate reading of data all the time.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are hereinafter described in detail in conjunction with the drawings. It is noted that the same or corresponding components in the drawings are denoted by the same reference characters and description thereof is not repeated here.

First Embodiment

A general configuration and operation of a DRAM (dynamic random-access memory) which is one example of the semiconductor memory device is now described as a whole.

Figure 1:
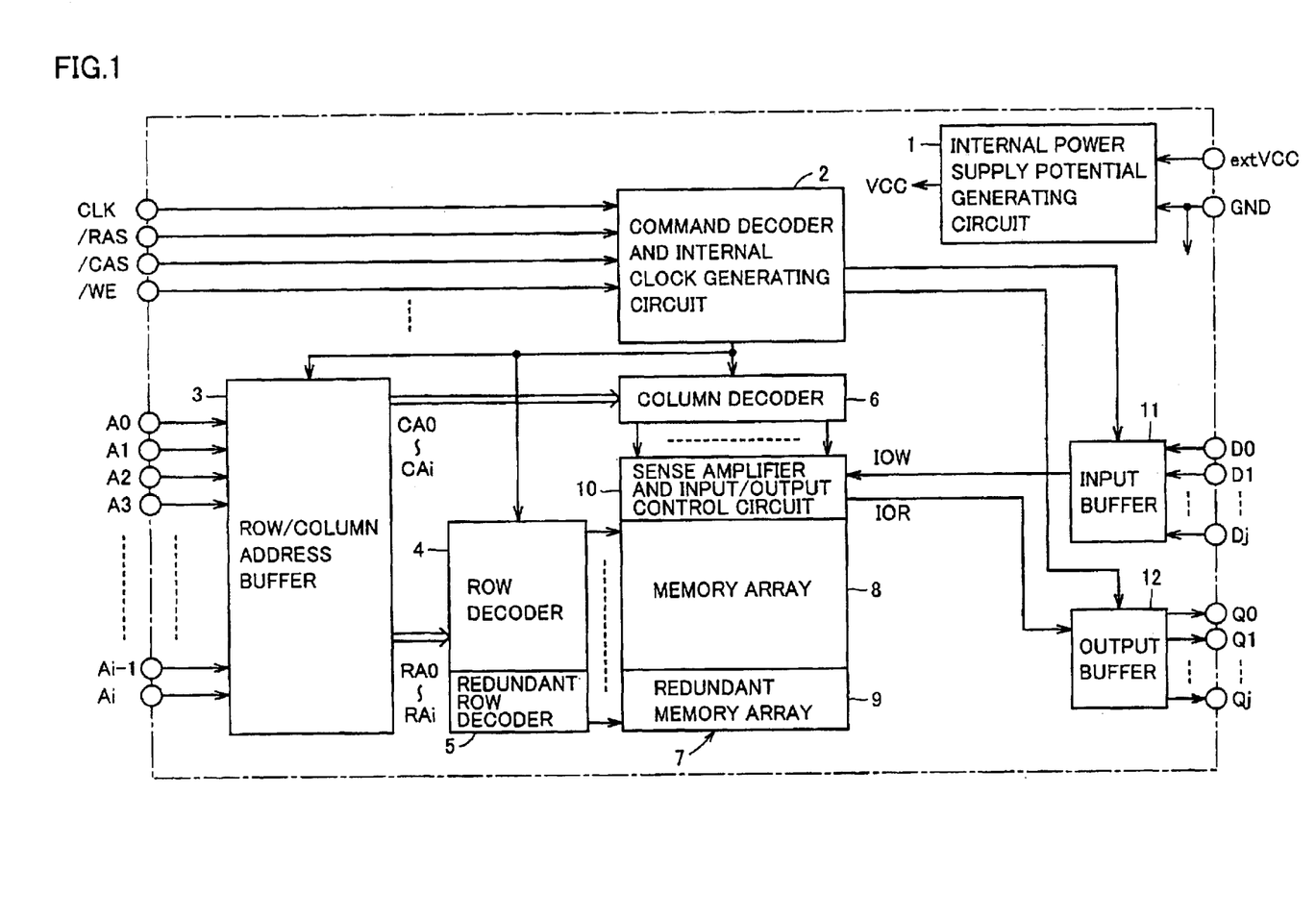
FIG. 1 is a block diagram schematically showing a configuration of a DRAM as one example of the semiconductor memory device.

Referring to FIG. 1, the DRAM includes an internal power supply potential generating circuit 1, a command decoder and clock generating circuit 2, a row/column address buffer 3, a row decoder 4, a redundant row decoder 5, a column decoder 6, a memory mat 7, an input buffer 11 and an output buffer 12. Memory mat 7 includes a memory array 8, a redundant memory array 9 and a sense amplifier and input/output control circuit 10.

Internal power supply potential generating circuit 1 receives an external power supply potential extVCC and a ground potential GND to generate an internal power supply potential VCC (hereinafter simply referred to as supply potential VCC) lower than external power supply potential extVCC to provide the resultant supply potential VCC to the whole DRAM. Supply potential VCC is tunable by a group of fuses provided in internal power supply potential generating circuit 1.

Command decoder and clock generating circuit 2 generates an internal clock and simultaneously selects a predetermined operation mode according to externally supplied signals CLK, /RAS, /CAS and /WE for example to control the whole DRAM. The command decoder of command decoder and clock generating circuit 2 may be configured to be controlled by chip select signal /CS and write control signal /WE for example to establish an interface compatibility with SRAM (static random-access memory).

Row/column address buffer 3 generates row address signals RA0–RAi and column address signals CA0–CAi according to externally supplied address signals A0–Ai (i is an integer of at least 0) and provides the generated signals RA0–RAi and signals CA0–CAi to row decoders 4 and 5 and to column decoder 6.

Memory array 8 includes a plurality of memory cells arranged in rows and columns that each store 1-bit data. Each memory cell is placed at a predetermined address determined by row and column addresses.

Row decoder 4 designates, in response to row address signals RA0–RAi supplied from row/column address buffer 3, a row address of memory array 8.

Redundant row decoder 5 includes therein, a group of fuses for programming a row address of memory array 8 that includes a defective memory cell and programming a row address of redundant memory array 9 that replaces the row address including the defective memory cell. When row address signals RA0–RAi corresponding to the defective row address (of memory array 8) programmed by the group of fuses are supplied, row decoder 4 does not designate this address while redundant row decoder 5 designates the programmed row address of redundant memory array 9 instead of the row address (of memory array 8). In other words, the defective memory cell row including the defective memory cell in memory array 8 is replaced with the normal memory cell row in redundant memory array 9.

Column decoder 6 designates, in response to column address signals CA0–CAi supplied from row/column address buffer 3, a column address of memory array 8.

Sense amplifier and input/output control circuit 10 connects a memory cell of an address designated by row decoder 4 (or redundant row decoder 5) and column decoder 6 to one end of a pair of data input/output lines for writing IOW or a pair of data input/output lines for reading IOR. The other end of the pair of data input/output lines for writing IOW is connected to input buffer 11. The other end of the pair of data input/output lines for reading IOR is connected to output buffer 12.

In write mode, input buffer 11 provides, according to a logical combination of externally supplied signals CLK, /RAS, /CAS and /WE for example, data Dj externally supplied through a Dj terminal (e.g. j is a natural number), to a selected memory cell via the pair of write data input/output lines IOW.

In read mode, output buffer 12 supplies, to the external, according to a logical combination of externally supplied signals CLK, /RAS, /CAS and /WE for example, read data Qj read from a selected memory cell via the pair of read data input/output lines IOR.

Figure 2:
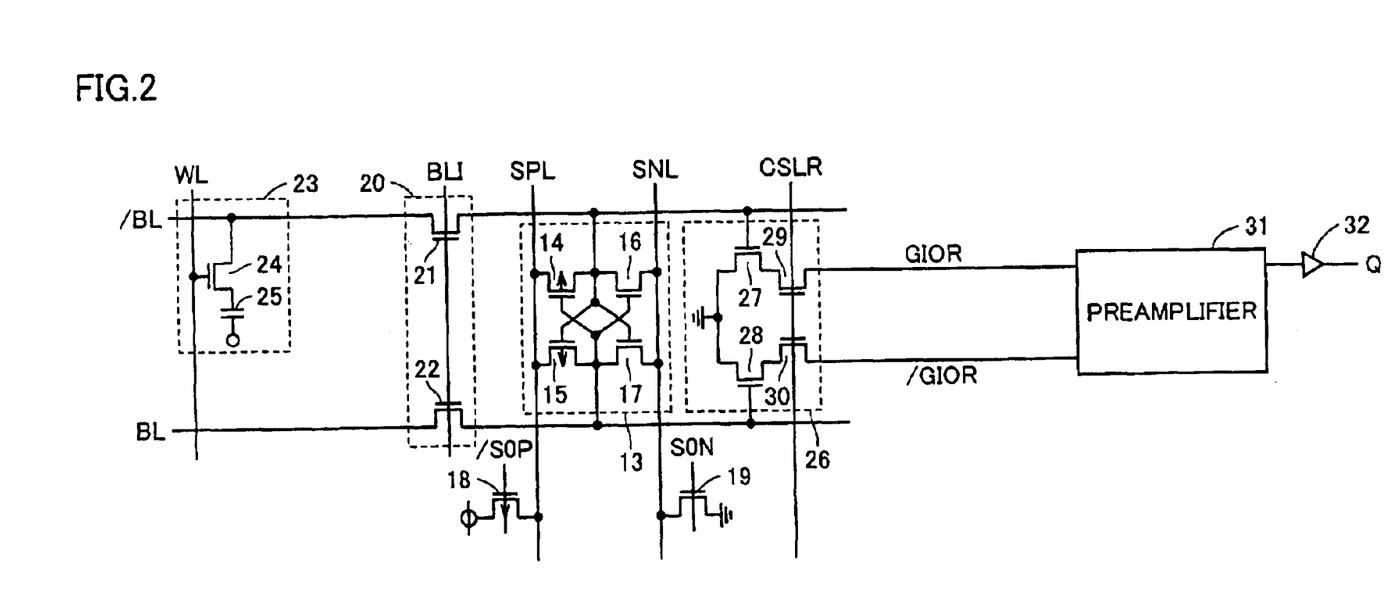
FIG. 2 is a circuit diagram partially showing a circuit configuration of a memory mat 7, in the DRAM shown in FIG. 1, that is described as the background of the present invention.

Referring to FIG. 2 showing memory mat 7 to be described as the background of the present invention, memory mat 7 of the DRAM shown in FIG. 1 includes a sense amplifier 13, a P-channel MOS transistor 18, an N-channel MOS transistor 19, a bit line isolation control circuit 20, a memory cell 23, a read gate circuit 26, a preamplifier 31, and a main amplifier 32.

Sense amplifier 13 is connected between paired bit lines BL and /BL. Sense amplifier 13 includes P-channel MOS transistors 14 and 15 connected to a sense amplifier activation line SPL and N-channel MOS transistors 16 and 17 connected to a sense amplifier activation line SNL. Sense amplifier activation line SPL is driven to supply potential VCC by a sense amplifier activation signal /S0P supplied to P-channel MOS transistor 18. Sense amplifier activation line SNL is driven to ground potential GND by a sense amplifier activation signal S0N supplied to N-channel MOS transistor 19.

Bit line isolation control circuit 20 includes N-channel MOS transistors 21 and 22 and, according to a bit line isolation signal BLI, electrically makes connection/disconnection between paired bit lines BL and /BL of sense amplifier 13 side and paired bit lines BL and /BL of memory cell 23 side.

Memory cell 23 includes an N-channel MOS transistor 24 having its gate connected to a word line WL and its drain connected to bit line /BL, and a capacitor 25 having one terminal connected to the source of N-channel MOS transistor 24 and the other terminal fixed at a predetermined potential. This memory cell 23 shown is one of a plurality of memory cells included in memory mat 7.

Read gate circuit 26 is connected between paired bit lines BL and /BL. Read gate circuit 26 includes N-channel MOS transistors 27 and 28 having respective gates connected to paired bit lines BL and /BL respectively and respective sources both connected to a ground node, and N-channel MOS transistors 29 and 30 having respective sources connected to respective drains of N-channel MOS transistors 27 and 28 and respective drains connected to paired read data lines GIOR and /GIOR respectively. N-channel MOS transistors 29 and 30 are turned on/off in response to activation/inactivation of a column selection line CSLR.

Preamplifier 31 is connected to paired read data lines GIOR and /GIOR and receives data read onto the paired read data lines to provide a single-ended output.

Main amplifier 32 buffers the single-ended output data from preamplifier 31 to output the resultant data to a data output pin Q.

Figure 3:
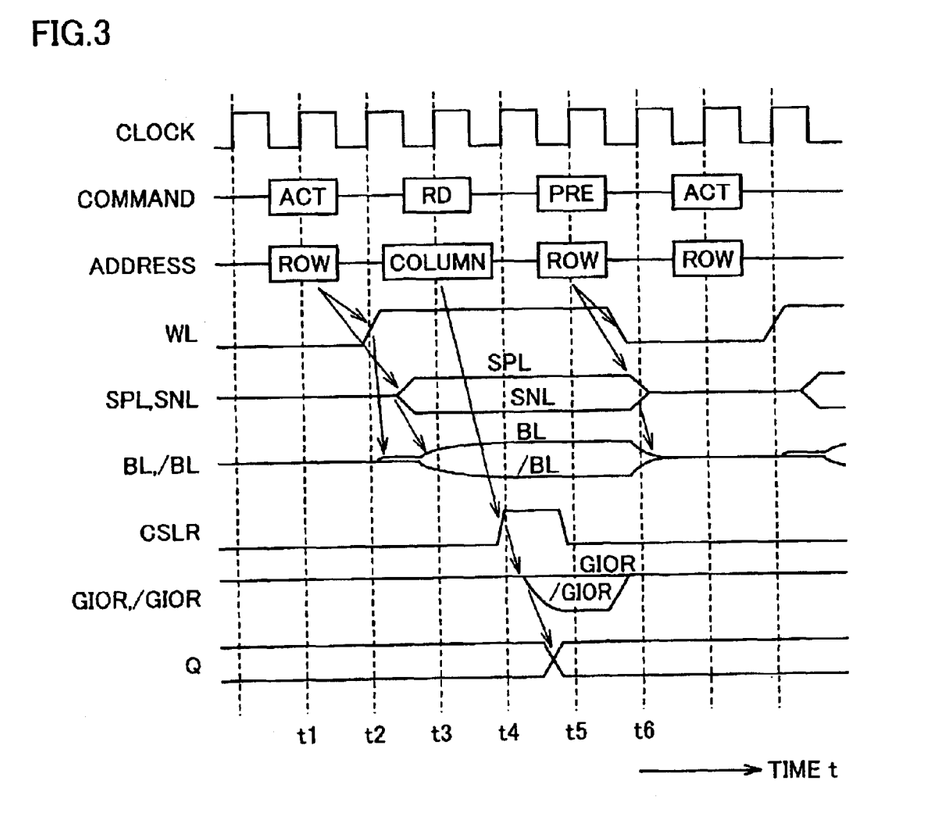
FIG. 3 is an operational waveform chart partially illustrating an operation of the memory mat 7 shown in FIG. 2 and described as the background of the invention.

FIG. 3 is an operational waveform chart partially illustrating an operation of memory mat 7 which is described as the background of the present invention.

At time t1, an ACT command (activation command) is issued and a row address is input.

At time t2, in response to the input of the row address, word line WL is activated. The activation of word line WL causes N-channel MOS transistor 24 in memory cell 23 to be turned on and accordingly charge is flown from capacitor 25 to bit line /BL. Thus, a slight potential difference between paired bit lines BL and /BL occurs that are both equalized to VCCa/2 in advance. Here, VCCa represents an amplitude voltage of the memory cell array in the DRAM.

By the input of the row address, sense amplifier activation lines SPL and SNL both equalized to VCCa/2 in advance are driven respectively to the supply potential VCC and ground potential GND. Accordingly, the slight potential difference between paired bit lines BL and /BL is amplified to the potential difference between the supply potential VCC and ground potential GND.

At time t3, an RD command (read command) is issued and a column address is input.

At time t4, in response to the input of the column address, read column selection line CSLR is activated. By the activation of read column selection line CSLR, paired read data lines GIOR and /GIOR that are complementary to each other and both precharged to H (logical high) level in advance are driven respectively to H level and L level according to data read onto paired bit lines BL and /BL.

The data output onto paired read data lines GIOR and /GIOR is output to data output pin Q through preamplifier 31 and main amplifier 32.

At time t5, a PRE command (precharge command) is issued and a row address is input. In response to the input of the row address, word line WL is inactivated.

At time t6, the input of the row address causes sense amplifier activation lines SPL and SNL both to be equalized to VCCa/2. Accordingly, paired bit lines BL and /BL are both equalized to VCCa/2.

In the circuit configuration of memory mat 7 shown in FIG. 2 and discussed above as the background of the present invention, respective sources of N-channel MOS transistors 27 and 28 in read gate circuit 26 are both connected to the ground node and paired bit lines BL and /BL are both equalized to VCCa/2 prior to activation of sense amplifier 13. Thus, before activation of sense amplifier 13, both of N-channel MOS transistors 27 and 28 are in ON state.

Then, if read column selection line CSLR is selected before sense amplifier 13 is activated, N-channel MOS transistors 29 and 30 are turned on while N-channel MOS transistors 27 and 28 are in the ON state. Then, the charges on paired read data lines GIOR and /GIOR having been precharged are both pulled down toward the ground. Both of the inputs of the preamplifier thus have L level, which means that the data could not be read accurately in some cases. A circuit configuration of memory mat 7 devised for addressing the above-mentioned problem is described below.

Figure 4:
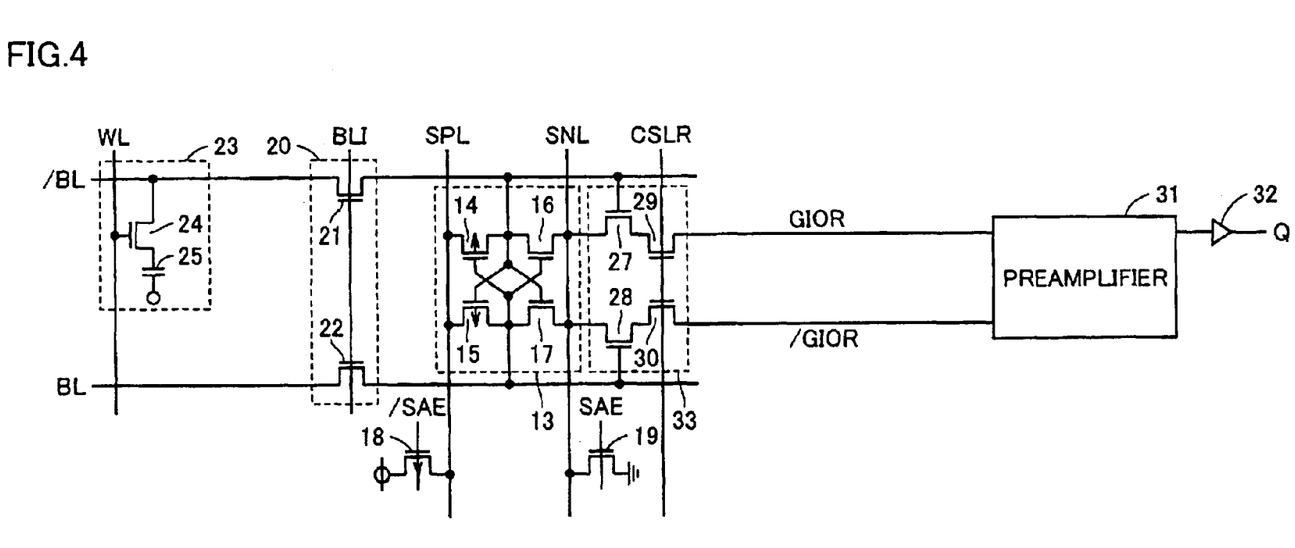
FIG. 4 is a circuit diagram partially showing a circuit configuration of a memory mat 7 according to a first embodiment, in the DRAM shown in FIG. 1.

A memory mat 7 of the first embodiment shown in FIG. 4 includes a read gate circuit 33 instead of the read gate circuit 26 in memory mat 7 shown in FIG. 2 and discussed above as the background of the present invention. A difference between read gate circuit 26 and read gate circuit 33 is that, respective sources of N-channel MOS transistors 27 and 28 in read gate circuit 33 are connected to sense amplifier activation line SNL of sense amplifier 13 instead of the ground node. Here, respective sense amplifier activation signals supplied to P-channel MOS transistor 18 and N-channel MOS transistor 19 are indicated respectively by /SAE and SAE.

Figure 5:
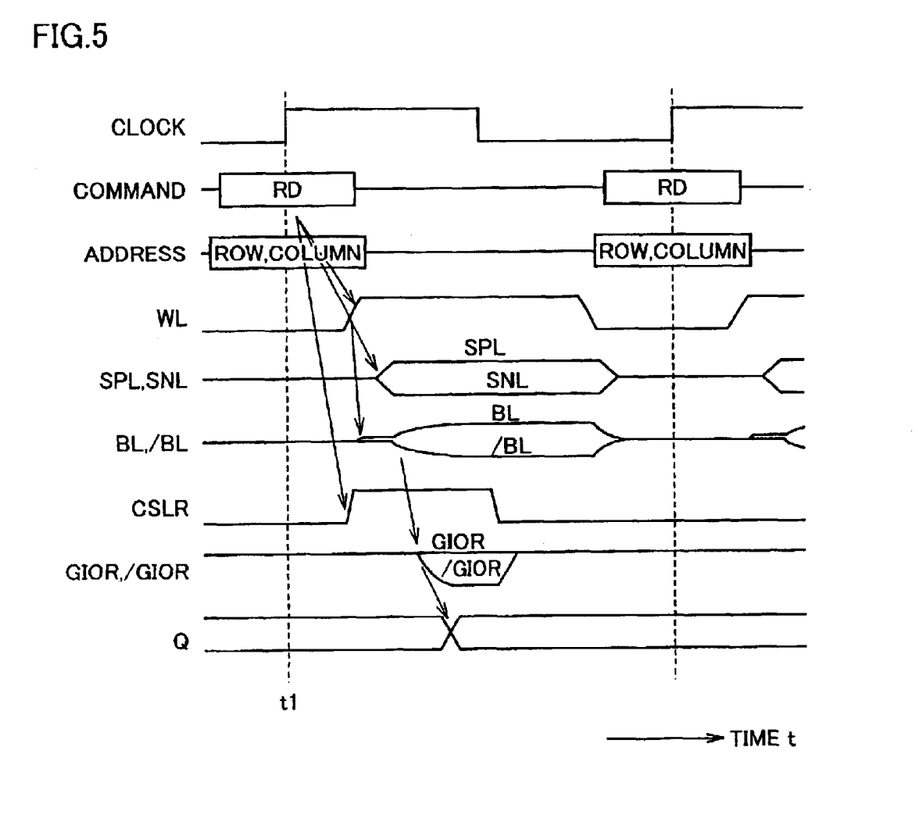
FIG. 5 is an operational waveform chart partially illustrating an operation of the memory mat 7 of the first embodiment shown in FIG. 4.

FIG. 5 is an operational waveform chart partially illustrating an operation of memory mat 7 of the first embodiment shown in FIG. 4.

At time t1, an RD command (read command) is issued and row and column addresses are simultaneously input.

In response to the input of the row address, word line WL is activated. The activation of word line WL causes N-channel MOS transistor 24 in memory cell 23 to be turned on and accordingly charge is flown from capacitor 25 to bit line /BL. Then, there arises a slight potential difference between paired bit lines BL and /BL that are both equalized to VCCa/2 in advance.

On the other hand, in response to the input of the column address supplied simultaneously with the row address, read column selection line CSLR is activated prior to activation of sense amplifier 13.

After read column selection line CSLR is activated, sense amplifier activation lines SPL and SNL that are both equalized to VCCa/2 in advance are driven respectively to the supply potential VCC and ground potential GND in response to the input of the row address. Then, the slight potential difference between paired bit lines BL and /BL is amplified to the potential difference between the supply potential VCC and ground potential GND.

By the amplification of the slight potential difference between paired bit lines BL and /BL to the potential difference between the supply potential VCC and ground potential GND, paired read data lines GIOR and /GIOR complementary to each other and both precharged in advance to H (logical high) level are driven respectively to H level and L level according to data read onto paired bit lines BL and /BL.

Data output onto paired read data lines GIOR and /GIOR is output to data output pin Q through preamplifier 31 and main amplifier 32.

In the circuit configuration as discussed above of memory mat 7 of the first embodiment that is shown in FIG. 4, respective sources of N-channel MOS transistors 27 and 28 are connected to sense amplifier activation line SNL and thus both of N-channel MOS transistors 27 and 28 are in the state of OFF before activation of sense amplifier 13.

Accordingly, even if read column selection line CSLR is selected prior to the activation of sense amplifier 13, data is accurately read. This is because both of N-channel MOS transistors 27 and 28 are in OFF state, thus charges on paired read data lines GIOR and /GIOR having been precharged are never pulled down to the ground and the inputs to the preamplifier are never driven to L level.

Therefore, respective sources of N-channel MOS transistors 27 and 28 can be connected to sense amplifier activation line SNL for allowing read column selection line CSLR to be selected prior to activation of sense amplifier 13. The waiting time from the issue of the ACT command to the issue of the RD command that is required for the conventional DRAM is thus eliminated.

Accordingly, the DRAM of the first embodiment achieves faster data reading than the conventional DRAM which has to wait until a potential difference between bit lines is amplified to a sufficient degree after activation of the sense amplifier and then activate the column selection line. The discussion above is applicable to fast data writing as well.

In general, a delay element is employed for adjusting the timing for allowing the column selection line to be selected after amplification by the sense amplifier attains a sufficient degree. The delay value of the delay element, however, could considerably vary depending on variations in the process as well as variations in the power supply voltage and ambient temperature. For the memory mat 7 of the conventional DRAM, the adjustment of the timing to include such variations in a margin is necessary, which is one of the factors responsible for delay of data output.

On the other hand, for memory mat 7 of the DRAM according to the first embodiment, such fine adjustment of the operation timing of the column selection line is unnecessary. Therefore, there is little influence due to variations in the process and variations in the supply voltage and ambient temperature. Then, even under the conditions of the worst process variation, the minimum voltage and high temperature for example that generally result in operational delay of the DRAM, the degree of delay of the DRAM is lower than that of the conventional DRAM.

According to the first embodiment as discussed above, respective sources of N-channel MOS transistors 27 and 28 are connected to sense amplifier activation line SNL to achieve fast random access as well as constantly accurate data reading.

Moreover, as the fine adjustment of the operation timing of the column selection line is unnecessary, there is little influence due to variations in the process as well as variations in the supply voltage and ambient temperature.

Second Embodiment

Figure 6:
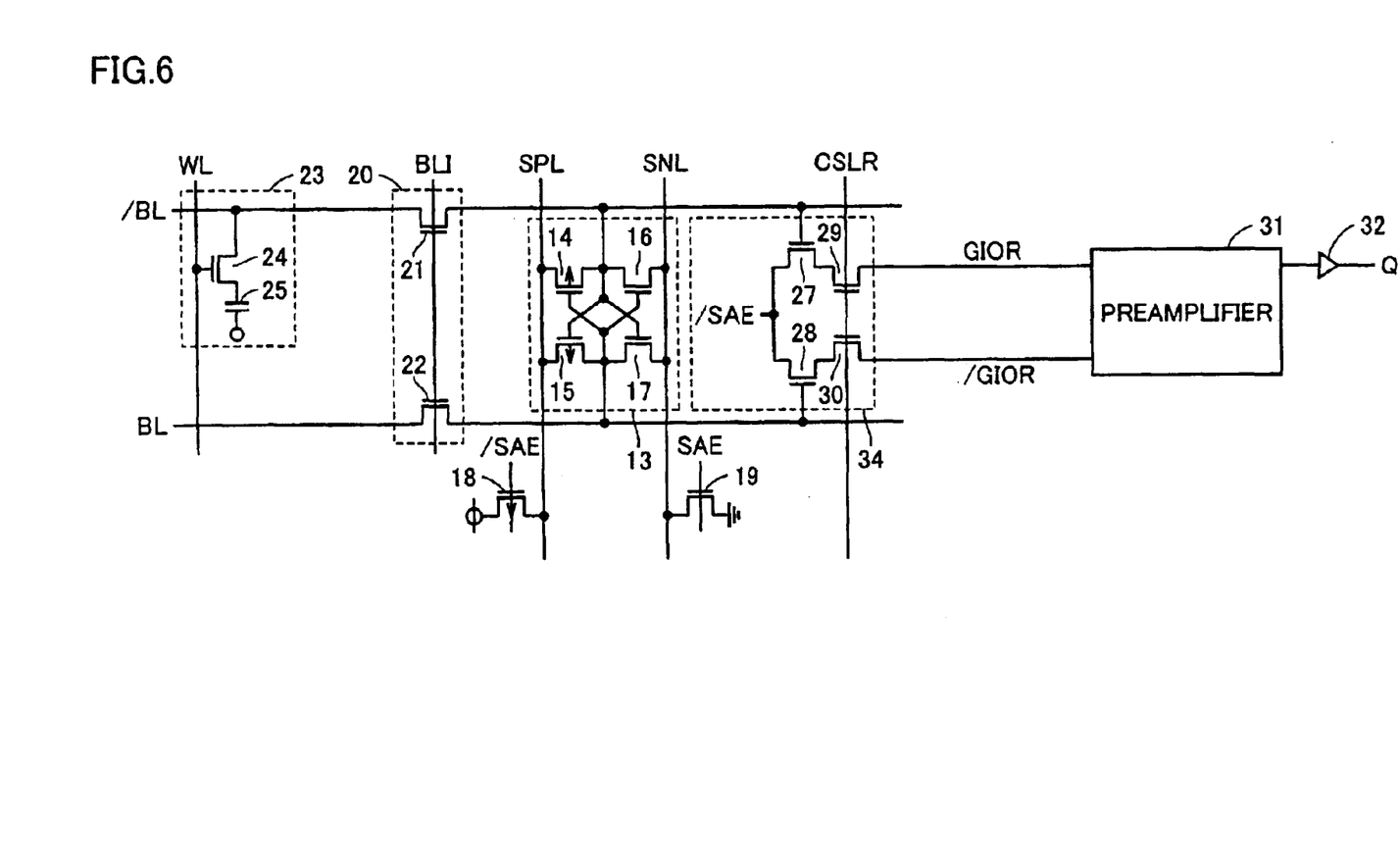
FIG. 6 is a circuit diagram partially showing a circuit configuration of a memory mat 7, in the DRAM shown in FIG. 1, according to a second embodiment of the present invention.

According to a second embodiment, a memory mat 7 shown in FIG. 6 includes a read gate circuit 34 instead of read gate circuit 26 in memory mat 7 shown in FIG. 2 and described as the background of the present invention. A difference between read gate circuit 26 and read gate circuit 34 is that respective sources of N-channel MOS transistors 27 and 28 of read gate circuit 34 are not connected to the ground node but connected to a node which provides a sense amplifier activation signal /SAE. Here, sense amplifier activation signals supplied respectively to P-channel MOS transistor 18 and N-channel MOS transistor 19 are indicated by /SAE and SAE respectively.

An operational waveform chart partially illustrating an operation of memory mat 7 of the second embodiment is similar to that of the first embodiment shown in FIG. 5 and thus description thereof is not repeated here. As sense amplifier activation line SNL, sense amplifier activation signal /SAE has L level during the activation period of sense amplifier 13 and has H level in the period except for this activation period.

Respective sources of N-channel MOS transistors 27 and 28 are thus connected to the node for sense amplifier activation signal /SAE, allowing read column selection line CSLR to be selected before activation of sense amplifier 13. In this way, the waiting time from the issue of the ACT command to the issue of the RD command is eliminated, as accomplished in the first embodiment, that is unavoidable in the conventional DRAM.

According to the second embodiment as discussed above, respective sources of N-channel MOS transistors 27 and 28 are connected to the node for sense amplifier activation signal /SAE to achieve fast random access as well as constantly accurate data reading.

Third Embodiment

The paired read data lines GIOR and /GIOR in memory mat 7 of the first and second embodiments are in a floating state in the period from the time that they are precharged to H level to the time that they are driven by read gate circuit 33. In this period, both of the paired data lines GIOR and /GIOR could transiently fall to L level due to influences of noise for example. A circuit configuration of a memory mat 7 devised for overcoming this problem is described below.

Figure 7:
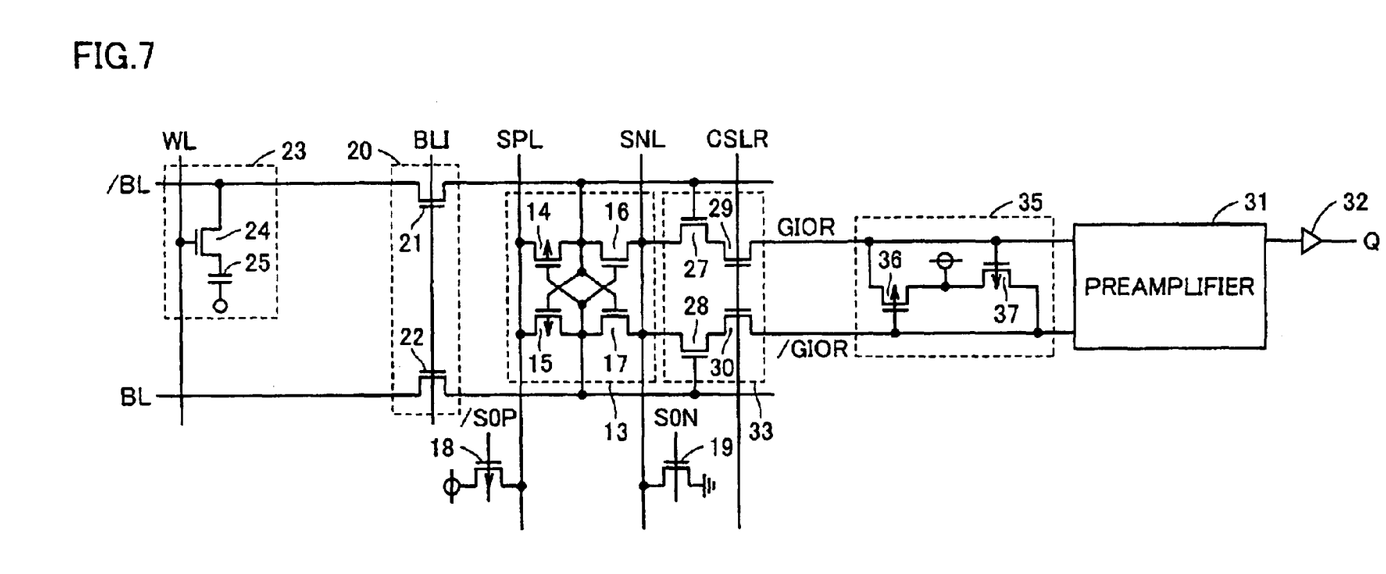
FIG. 7 is a circuit diagram partially showing a circuit configuration of a memory mat 7, in the DRAM shown in FIG. 1, according to a third embodiment of the present invention.

According to a third embodiment, memory mat 7 shown in FIG. 7 has a circuit configuration including a cross-coupling circuit 35 connected between the pair of read data lines GIOR and /GIOR and preamplifier 31 to further improve the memory mat 7 of the first embodiment shown in FIG. 4.

Cross-coupling circuit 35 includes P-channel MOS transistors 36 and 37. P-channel MOS transistor 36 has its gate connected to read data line /GIOR, its source connected to the power supply node and its drain connected to read data line GIOR. P-channel MOS transistor 37 has its gate connected to read data line GIOR, its source connected to the power supply node and its drain connected to read data line /GIOR.

In cross-coupling circuit 35, when read data line GIOR has L level, P-channel MOS transistor 36 is turned on and read data line /GIOR has H level. On the contrary, when read data line /GIOR has L level, P-channel MOS transistor 37 is turned on and read data line GIOR has H level. Thus, it never occurs that both of the paired data lines GIOR and /GIOR have L level.

According to the third embodiment as described above, cross-coupling circuit 35 is connected between the pair of read data lines GIOR and /GIOR and preamplifier 31 in memory mat 7, and accordingly it is prevented that both of the paired data lines GIOR and /GIOR are transiently driven to L level.

An operational waveform chart partially illustrating an operation of memory mat 7 of the third embodiment is similar to that of the first embodiment shown in FIG. 5 and description thereof is not repeated here.

According to the third embodiment as discussed above, respective sources of N-channel MOS transistors 27 and 28 are connected to sense amplifier activation line SNL to achieve fast random access as well as constantly accurate data reading.

Moreover, cross-coupling circuit 35 connected between the pair of read data lines GIOR and /GIOR and preamplifier 31 prevents paired data lines GIOR and /GIOR both from being transiently driven to L level.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a memory cell array including a plurality of memory cells arranged in rows and columns, a plurality of word lines arranged correspondingly to respective rows of said plurality of memory cells and a plurality of pairs of bit lines arranged correspondingly to respective columns of said plurality of memory cells;
   a sense amplifier provided correspondingly to each of said plurality of pairs of bit lines; and
   a read gate circuit provide correspondingly to each of said plurality of pairs of bit lines and connected to a pair of read data lines for reading data,
   said read gate circuit including
   a first transistor having its gate connected to one bit line of the corresponding pair of bit lines and its source arranged to dynamically change according to activation/inactivation of said sense amplifier and
   a second transistor having its gate connected to other bit line of said corresponding pair of bit lines and its source arranged to dynamically change according to activation/inactivation of said sense amplifier.

2. The semiconductor memory device according to claim 1, further comprising:
   a first sense amplifier activation line arranged to be connected to a ground node according to a sense amplifier activation signal; and
   a second sense amplifier activation line arranged to be connected to a power supply node according to a signal complementary to said sense amplifier activation signal, wherein
   said first and second transistors have respective sources both connected to said first sense amplifier activation line.

3. The semiconductor memory device according to claim 1, further comprising:
   a first sense amplifier activation line arranged to be connected to a ground node according to a sense amplifier activation signal; and
   a second sense amplifier activation line arranged to be connected to a power supply node according to a signal complementary to said sense amplifier activation signal, wherein
   said first and second transistors have respective sources both connected to a node providing said sense amplifier activation signal.

4. The semiconductor memory device according to claim 1, further comprising a cross-coupling circuit provided correspondingly to said pair of read data lines,
   said cross-coupling circuit including
   a third transistor having its gate connected to one read data line of said pair of read data lines, its source connected to a power supply node and its drain connected to the other read data line of said pair of read data lines and
   a fourth transistor having its gate connected to the other read data line of said pair of read data lines, its source connected to the power supply node and its drain connected to one read data line of said pair of read data lines.

* * * * *